United States Patent
Lojek et al.

(10) Patent No.: US 6,624,029 B2
(45) Date of Patent: Sep. 23, 2003

(54) METHOD OF FABRICATING A SELF-ALIGNED NON-VOLATILE MEMORY CELL

(75) Inventors: Bohumil Lojek, Colorado Springs, CO (US); Alan L. Renninger, Cupertino, CA (US)

(73) Assignee: Atmel Corporation, San Jose, CA (US)

(*) Notice: Subject to any disclaimer, the term of this patent is extended or adjusted under 35 U.S.C. 154(b) by 0 days.

(21) Appl. No.: 10/236,670

(22) Filed: Sep. 6, 2002

(65) Prior Publication Data
US 2003/0013255 A1 Jan. 16, 2003

Related U.S. Application Data

(63) Continuation-in-part of application No. 09/727,571, filed on Nov. 30, 2000.

(51) Int. Cl.[7] .......................................... H01L 21/8247
(52) U.S. Cl. ................... 438/267; 438/267; 257/316; 257/321
(58) Field of Search ................ 438/257–267; 257/314–322

(56) References Cited

U.S. PATENT DOCUMENTS

| | | | |
|---|---|---|---|
| 4,833,096 A | 5/1989 | Huang et al. ............... 437/29 |
| 5,021,848 A | 6/1991 | Chiu ........................ 357/23.5 |
| 5,108,939 A * | 4/1992 | Manley et al. ............. 437/43 |
| 5,477,068 A | 12/1995 | Ozawa ...................... 257/214 |
| 5,479,368 A | 12/1995 | Keshtbod ............... 365/185.01 |
| 5,618,742 A | 4/1997 | Shone et al. ............. 438/263 |
| 5,776,787 A | 7/1998 | Keshtbod .................... 437/43 |
| 5,786,612 A | 7/1998 | Otani et al. ............... 257/316 |
| 5,789,297 A | 8/1998 | Wang et al. .............. 438/267 |
| 5,963,806 A | 10/1999 | Sung et al. ............... 438/266 |
| 5,972,752 A | 10/1999 | Hong ....................... 438/264 |
| 6,043,530 A | 3/2000 | Chang ...................... 257/320 |
| 6,074,914 A | 6/2000 | Ogura ...................... 438/257 |
| 6,124,170 A * | 9/2000 | Lim et al. ................. 438/267 |

FOREIGN PATENT DOCUMENTS

| | | |
|---|---|---|
| JP | 11-154712 | 6/1999 |
| JP | 11-186416 | 7/1999 |

* cited by examiner

*Primary Examiner*—Caridad Everhart
*Assistant Examiner*—Calvin Lee
(74) *Attorney, Agent, or Firm*—Thomas Schneck

(57) ABSTRACT

Disclosed is a self-aligned non-volatile memory cell comprising a small sidewall spacer electrically coupled and being located next to a main floating gate region. Both the small sidewall spacer and the main floating gate region are formed on a substrate and both form the floating gate of the non-volatile memory cell. Both are isolated electrically from the substrate by an oxide layer which is thinner between the small sidewall spacer and the substrate; and is thicker between the main floating gate region and the substrate. The small sidewall spacer can be made small; therefore, the thin oxide layer area can also be made small to create a small pathway for electrons to tunnel into the floating gate.

12 Claims, 6 Drawing Sheets

METHOD OF FABRICATING A SELF-ALIGNED NON-VOLATILE MEMORY CELL

CROSS-REFERENCE TO RELATED APPLICATION

This application is a continuation-in-part of application Ser. No. 09/727,571, filed Nov. 30, 2000.

TECHNICAL FIELD

The invention relates to self-aligned non-volatile memory cells, and more particularly to a self-aligned non-volatile memory cell that has a high capacitive coupling ratio and has a thin and small tunneling oxide region.

BACKGROUND ART

FIG. 1 shows a sectional view of an EEPROM 100 (Electrically Erasable Programmable Read Only Memory) as depicted in FIG. 18 of U.S. Pat. No. 4,833,096 which is assigned to the same assignee as the present invention. With reference to FIG. 1 of the present application, a deep n-well 23 is formed inside a p-type substrate 40, and N-channel and memory cell devices are defined. N-channel stops and field oxide are formed around the device areas. Channel stops and field oxide are formed by thermally growing a thin oxide layer, depositing a 1000–2500 Å thick nitride layer and removing the nitride from non-device areas, implanting boron ions around the N-well and N-channel device areas, then driving in the boron and thermally growing oxide in the non-device areas not covered by nitride.

The process continues by implanting a first species of N-type impurity in a portion of the memory cell device area, thermally growing a first oxide layer 59, defining a window therein over the impurity implant, implanting a second species of N-type impurity into the window hole, and regrowing a thick oxide layer in the window. Next, a 2500–3400 Å thick polycrystalline silicon ("polysilicon") layer is deposited, and removed with the first oxide layer to form the floating gate 71. A second oxide layer is thermally grown at a temperature of 1000°–1050° C. which ensures that this second oxide layer has a substantially uniform thickness over both the polysilicon floating gate and the substrate. After adjusting the threshold of any enhancement devices, a second gate layer, of either polysilicon or a polysilicon/silicide sandwich, is deposited and selectively removed with the second oxide layer to define gates 95 and 97 for peripheral devices, as well as a second polysilicon gate 99 that, along with floating gate 71, forms a memory cell 30. Sources and drains are then formed using the polysilicon gates of the particular device as a self-aligning mask.

The process concludes by defining a double layer of conductive lines in the following manner. First, a boron/phosphorus-doped silica glass 121 covering is applied, contact holes 123 are etched, and the glass is heated to its flow temperature to round the corners of the contact holes. A first layer of conductive lines 131 is then defined. An insulative intermetal layer 133 is deposited, etched back and redeposited to form a substantially planar surface. Via holes 135 are wet/dry etched and the second layer of conductive lines 137 is then defined. A passivation layer 139 can be deposited over the second metal layer 137, or for single metal layer devices, over the first metal layer 131.

EEPROM 100 can program/erase faster if its coupling ratio can be made higher. Coupling ratio of memory cell 30 (and also of EEPROM 100) is the ratio of a first capacitance (not shown) formed between control gate 99 and floating gate 71 of cell 30 over the sum of the first capacitance and a second capacitance (not shown) formed between floating gate 71 and p-substrate 40 of cell 30. The first and second capacitances are in series; therefore, when the coupling ratio of memory cell 30 increases, with other factors being the same, the voltage drop between floating gate 71 and p-substrate 40 of cell 30 also increases. As a result, it is easier for electrons to tunnel through thin tunnel oxide layer 59 into floating gate 71. In other words, programming cell 30 becomes faster.

There are at least two methods to increase the coupling ratio of memory cell 30. A first method is to increase the first capacitance formed between control gate 99 and floating gate 71 of cell 30. One way to do this is to increase the overlapping area between control gate 99 and floating gate 71 of cell 30.

A second method is to decrease the second capacitance formed between floating gate 71 and p-substrate 40 of cell 30. This can be done by reducing the overlapping area between floating gate 71 and p-substrate 40 of cell 30. It should be noted that although increasing the thickness of a dedicated tunnel oxide region 59 between floating gate 71 and p-substrate 40 of cell 30 would decrease the second capacitance and hence increase the coupling ratio, that would also make it much harder for electrons to tunnel through the tunnel oxide region 59. Therefore, as a compromise, the dedicated tunnel oxide layer 59 should be thinner at only a small portion of the tunnel oxide region 130 to serve as a pathway for electrons to tunnel from p-substrate 40 into floating gate 71 and should be thicker at the rest of tunnel oxide region 59.

However, there is still room for improvement using the second method mentioned above. It is the object of the present invention to improve upon the prior art method of decreasing the second capacitance formed between the floating gate and the p-well or p-substrate, by providing a method of forming a memory cell in which the tunnel oxide region is thinner at a small portion in order to create a pathway for electrons to tunnel into the floating gate, while having the tunnel oxide region remain thicker at other places.

SUMMARY OF THE INVENTION

The non-volatile memory cell of the present invention has a small sidewall spacer electrically coupled and being located next to a main floating gate region. Both the small sidewall spacer and the main floating gate region are formed on a substrate and both form the floating gate of the non-volatile memory cell. Both are isolated electrically from the substrate by an oxide layer which is thinner between the small sidewall spacer and the substrate; and is thicker between the main floating gate region and the substrate. The small sidewall spacer can be made narrow; therefore, the thin portion of the oxide layer can also be made small to create a small pathway for electrons to tunnel into the floating gate.

BRIEF DESCRIPTION OF THE DRAWINGS

FIG. 2I shows the final memory cell structure. FIG. 2J is a different cross-sectional view of FIG. 2H.

BEST MODE FOR CARRYING OUT THE INVENTION

Figure 1:
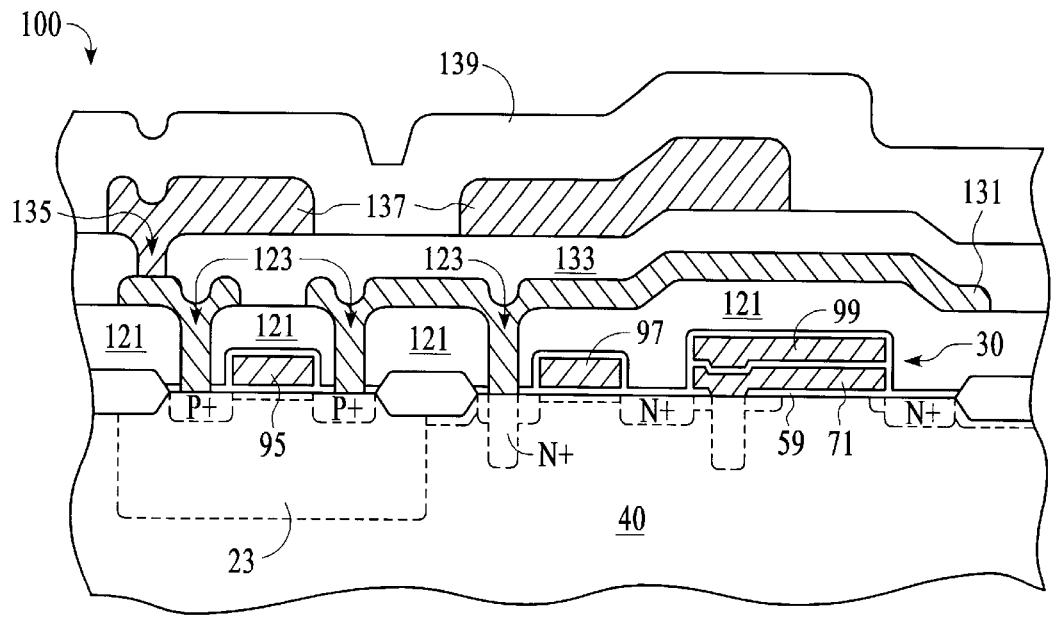
FIG. 1 is a sectional view of a typical EEPROM (Electrically Erasable Programmable Read Only Memory) of prior art.
Figure 2A:
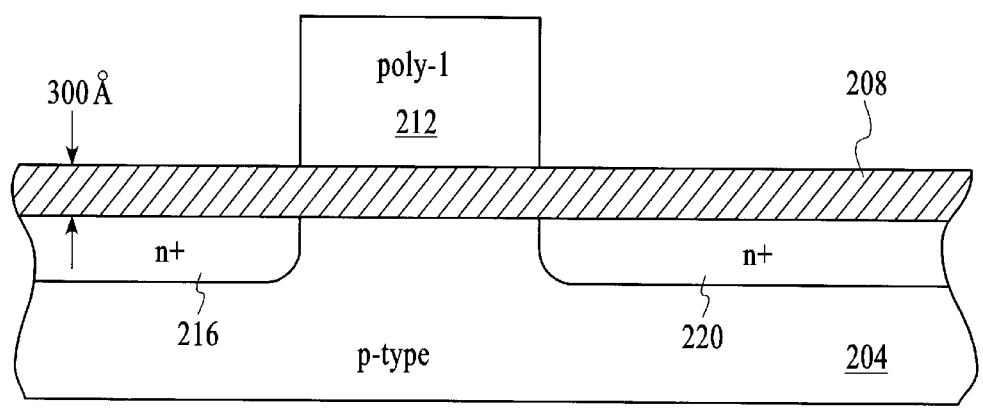
FIGS. 2A–2J are cross-sectional views which illustrate the steps in manufacturing the self-aligned non-volatile memory cell of the present invention.
Figure 2B:
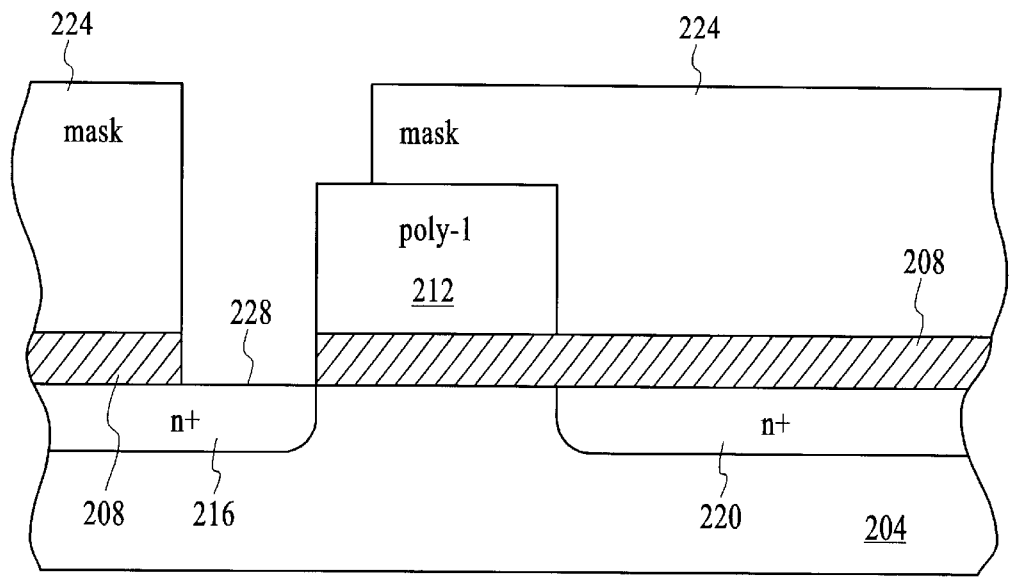
Figure 2C:
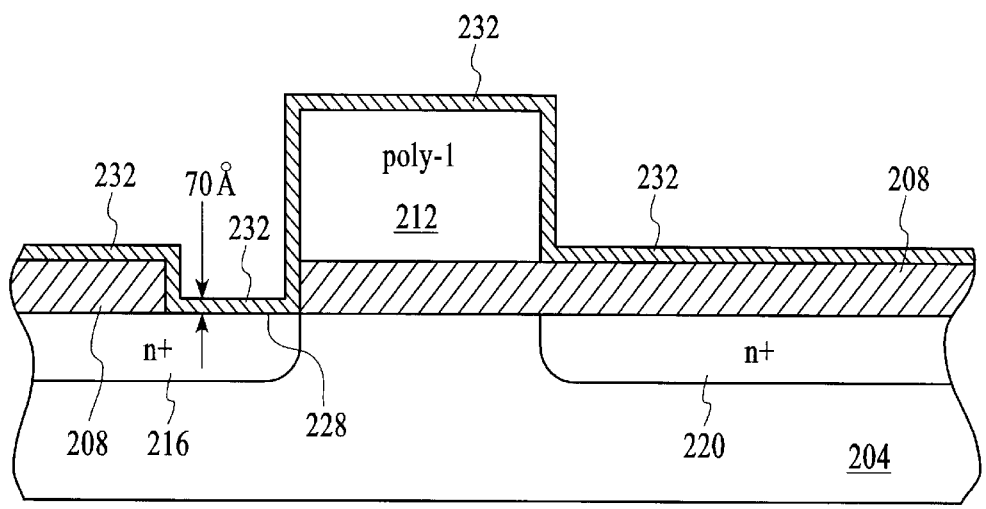
Figure 2D:
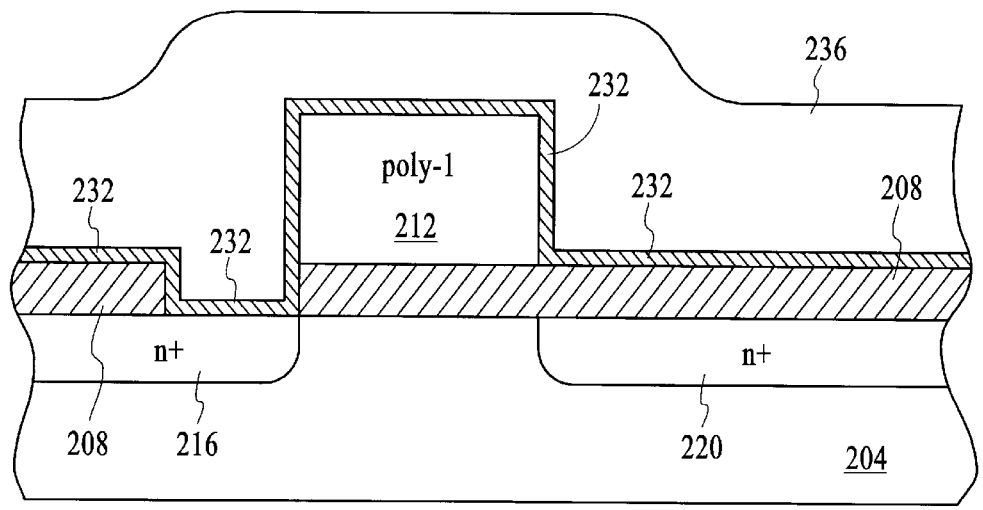
Figure 2E:
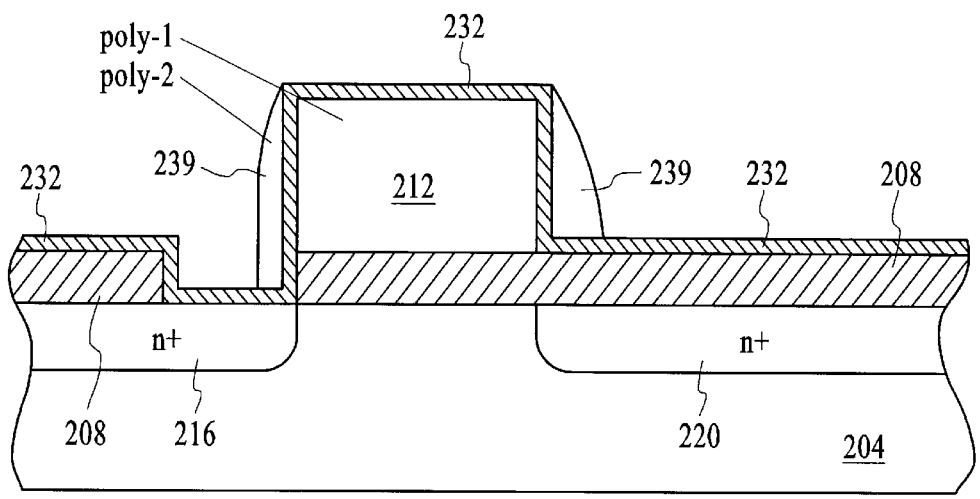
Figure 2F:
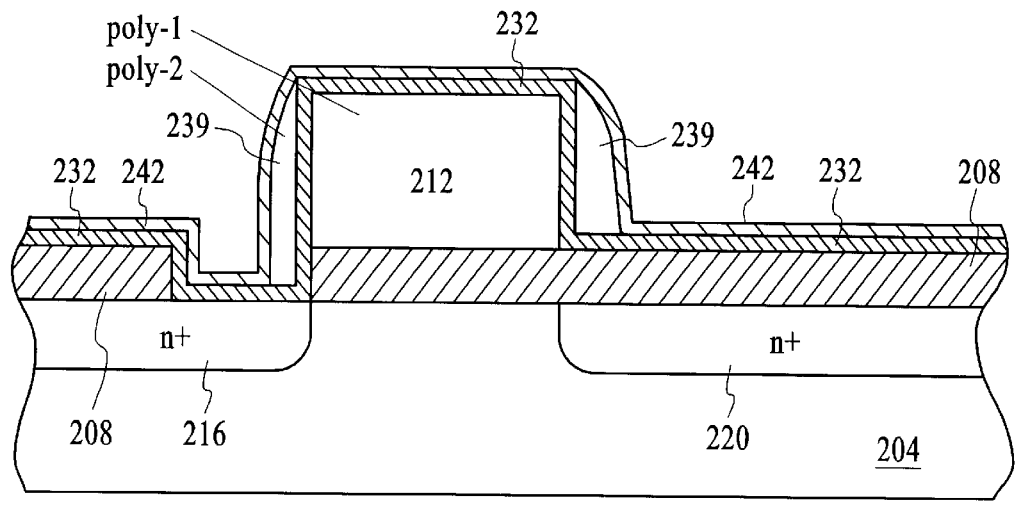
Figure 2G:
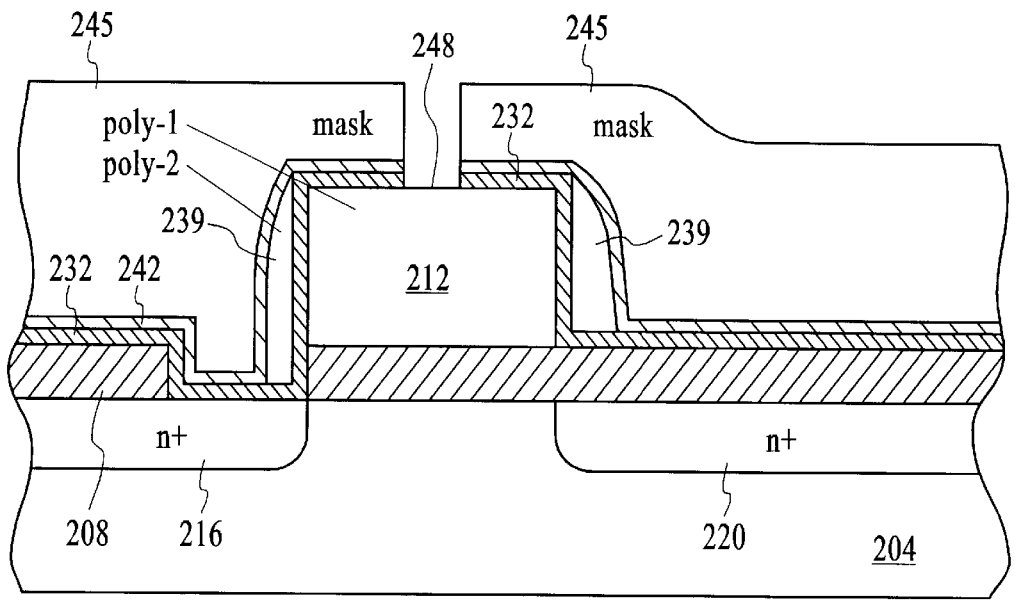
Figure 2H:
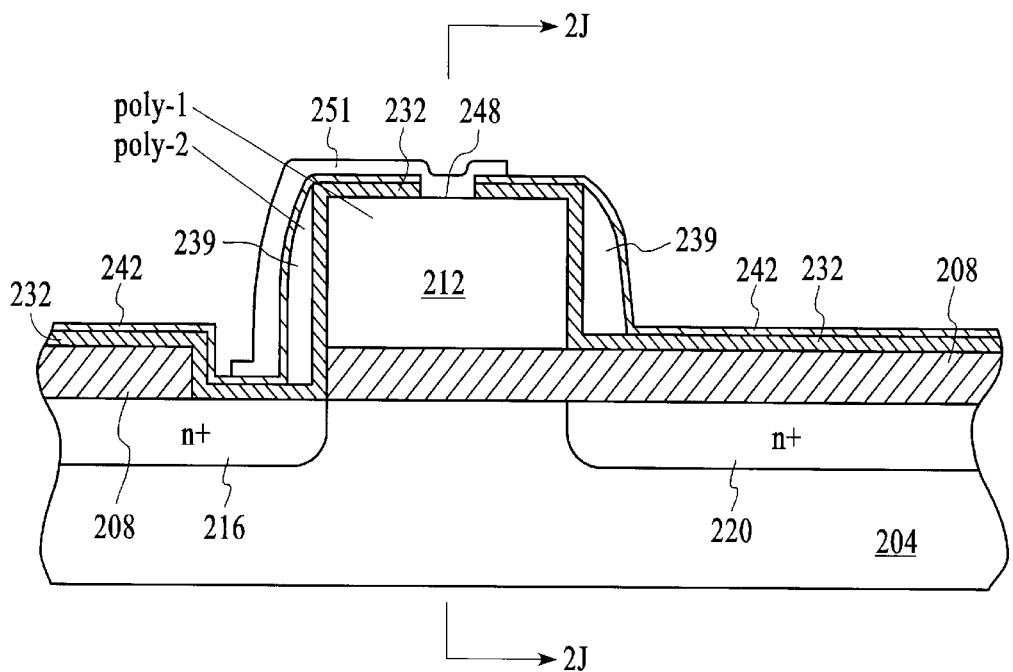

The final structure and operation of a nonvolatile memory cell 200 of the present invention, as shown in FIG. 2H, can be well understood by going through the steps for fabricating the same. With reference to FIG. 2A, the fabrication process of the non-volatile memory cell of the present invention starts with, for illustrative purposes, a p-type semiconductor substrate 204. A silicon oxide (SiO2) layer 208, about 300 Å (1 Å=10$^{-10}$ m) thick, is formed on substrate 204. In the next step, a first polysilicon (poly-1) layer 212 is deposited upon silicon oxide layer 208. Then, excessive portion of poly-1 layer 212 is etched away leaving only poly-1 region 212 as seen in FIG. 2A, which later serves as part of a floating gate 212, 239, 251 of memory cell 200 in FIG. 2H. In the next step, n+ regions 216 and 220 are implanted by ion bombardments. Poly-1 region 212 may be used as a mask. In other words, n+ regions 216 and 220 are self-aligned with the two opposing sides of poly-1 region 212.

With reference to FIG. 2B, photoresist masks 224 are used in wet-etching away a portion of silicon oxide layer 208 to expose surface 228 of n+ region 216. Then, masks 224 are removed.

With reference to FIG. 2C, a thin silicon oxide layer 232, about 70 Å thick, is formed upon the structure, and covers completely the structure, including surface 228.

With reference to FIG. 2D, a second polysilicon (poly-2) layer 236 is deposited to blanket thin silicon oxide layer 232. Poly-2 layer 236 is then dry-etched away leaving only a poly-2 sidewall spacer 239 surrounding poly-1 region 212 as seen in FIG. 2E. The etching operation can be carried out using an anisotropic etching method. At this time, poly-2 sidewall spacer 239 and poly-1 region 212 are electrically separated by thin silicon oxide layer 232.

With reference to FIG. 2F, a second thin oxide layer 242, about 70 Å thick, is formed upon the structure, and completely covers the structure, including the sidewall spacer 239. The second thin oxide layer serves to provide a new oxide layer on which to grow a subsequent polysilicon layer (poly-3) as will be described below. Forming the subsequent poly layer on the new oxide layer 242 is beneficial for reducing leakage currents and other issues associated with forming a poly layer on a surface that has been heavily oxidized.

With reference to FIG. 2G, photoresist masks 245 are used in wet-etching away a portion of thin silicon oxide layers 232 and 242 to expose a surface 248 on top of poly-1 region 212. Then, masks 245 are removed.

With reference to FIG. 2H, a third polysilicon (poly-3) layer 251 is deposited to blanket the entire structure. This thin poly-3 layer 251 has electrical contact with poly-1 region 212 via surface 248. The excessive portion of poly-3 layer 251 is then dry-etched away leaving only the necessary portion 251 as seen in FIG. 2H. The structure in FIG. 2H is also seen in FIG. 2J from a different cross-sectional view, indicated by the cut 2J—2J in FIG. 2H and by the cut 2H—2H in FIG. 2J.

Figure 2I:
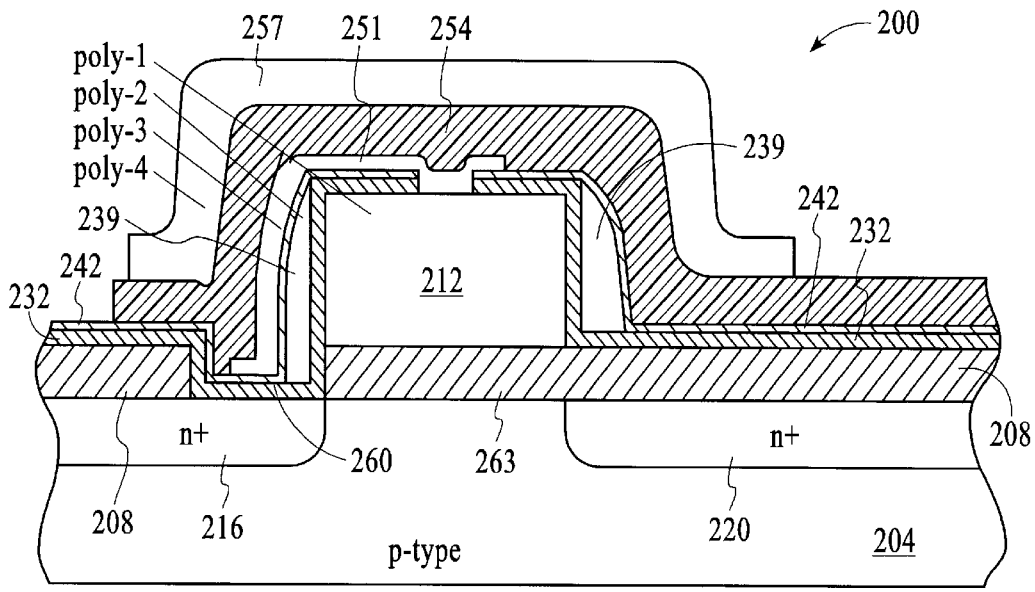
Figure 2J:
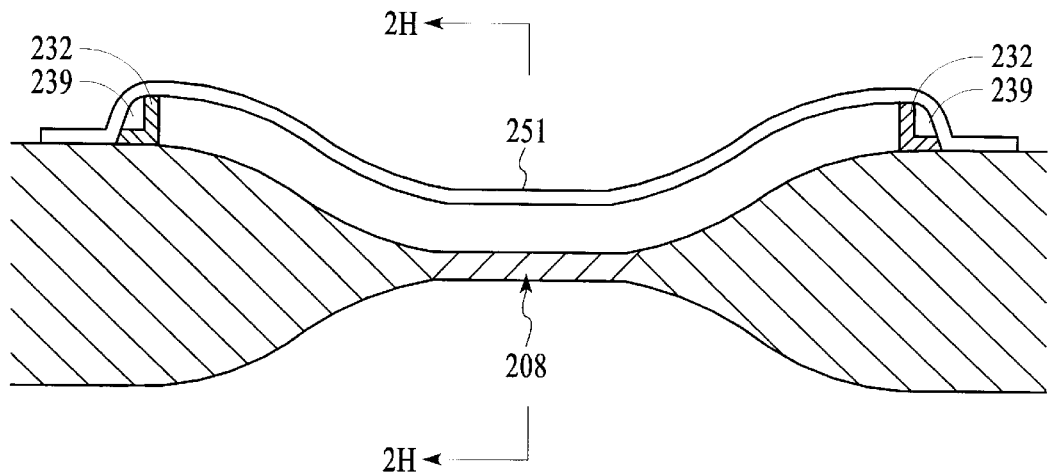

With reference to FIG. 2I, an insulating ONO (Oxide/Nitride/Oxide) layer 254 is deposited to blanket the structure. Then, masks are used to remove the excessive portion of insulating ONO layer 254 to the left. In the next step, a fourth polysilicon (poly-4) layer 257 is deposited to blanket the entire structure. Then, masks are used to remove excessive portion on both sides of the poly-4 layer 257 as seen in FIG. 2I. The structure of insulating ONO layer 254 and poly-4 layer 257 and the method of fabricating the same are well known in the art, and therefore are not discussed in detail here.

The final structure, seen in FIG. 2I, is a non-volatile memory cell 200. Poly-1 region 212, poly-2 sidewall spacer 239, and poly-3 layer 251 form a floating gate 212, 239, 251 of memory cell 200. Poly-4 layer 257 forms a control gate 257 of memory cell 200. Floating gate 212, 239, 251 and control gate 257, separated from each other by insulating ONO layer 254 form a first parallel-plate capacitor (not shown). Floating gate 212, 239, 251 and substrate 204 forms a second parallel-plate capacitor (not shown). The first and second parallel-plate capacitors are in series. The insulating layer between the two parallel plates of the second parallel-plate capacitor has two insulating portions. A first insulating portion 260 is thin and is formed by thin silicon oxide layers 232 and 242. First insulating portion 260 extends from the leftmost edge of poly-3 layer 251 to the rightmost edge of poly-2 sidewall spacer 239. A second insulating portion 263 of silicon oxide layer 208 that lies under poly-1 region 212 is substantially thicker than first insulating portion 260.

At a first look, both insulating portions 260 and 263 should be thick to keep low the capacitance of the second parallel-plate capacitor so as to keep high the coupling ratio of cell 200. However, such a high coupling ratio would not make programming the cell easier because although most of voltage difference between control gate 257 and drain 216 would appear between floating gate 212, 239, 251 and drain 216 due to the high coupling ratio, it would still be difficult for electrons to tunnel through the thick insulating portions 260 and 263. Memory cell 200 of the present invention solves this problem by making insulating portion 260 thin and small. As a result, insulating portion 260 becomes a pathway (or tunneling oxide region) for electrons to tunnel from drain 216 into poly-2 sidewall spacer 239 which is part of floating gate 212, 239, 251 to program memory cell 200. Making insulating portion 260 thin increases the capacitance of the second parallel-plate capacitor. However, because insulating portion 260 is small in area compared with insulating portion 263, the increase of capacitance of the second parallel-plate capacitor is much less than if both insulating portions 260 & 263 are made thin to let electrons to tunnel into floating gate 212, 239, 251. As a result, this makes it easier for electrons to tunnel from drain 216 through thin insulating portion 260 into poly-2 sidewall spacer 239 which is part of floating gate 212, 239, 251 so as to program memory cell 200.

Programming memory cell 200 can be done by applying a high voltage (e.g., 12V–15V) to control gate 257, a ground potential to drain 216 and source 220. Electrons will tunnel through thin insulating portion 260 into poly-2 sidewall spacer 239 which is part of floating gate 212, 239, 251 under Fowler-Nordheim tunneling effect. The electrons trapped in floating gate 212, 239, 251 increases the threshold voltage of memory cell 200 such that there is no conducting channel between drain 216 and source 220 in read mode. In other words, a programmed cell 200 represents a logic 0.

An unprogrammed cell 200 having no trapped electrons in its floating gate 212, 239, 251 has a normal threshold voltage. In read mode, for an unprogrammed cell 200, a conducting channel forms under insulating portion 263 between drain 216 and source 220. In other words, an unprogrammed cell 200 represents a logic 1. During read mode, the voltage applying to control gate 257 of memory cell 200 with respect to source 220 must be higher than the normal threshold voltage of an unprogrammed cell but must be lower than the increased threshold voltage of a programmed cell. As a result, during read mode, selected programmed cells 200 do not conduct and selected unprogrammed cells 200 conducts.

Erasing a programmed memory cell 200 can be done by applying a high voltage (e.g., 12V) to drain 216, a ground potential to both control gate 257 and source 220. Trapped electrons in floating gate 212, 239, 251 tunnels through thin insulating portion 260 to drain 216. Thereby, the cell becomes unprogrammed.

Figure 3:
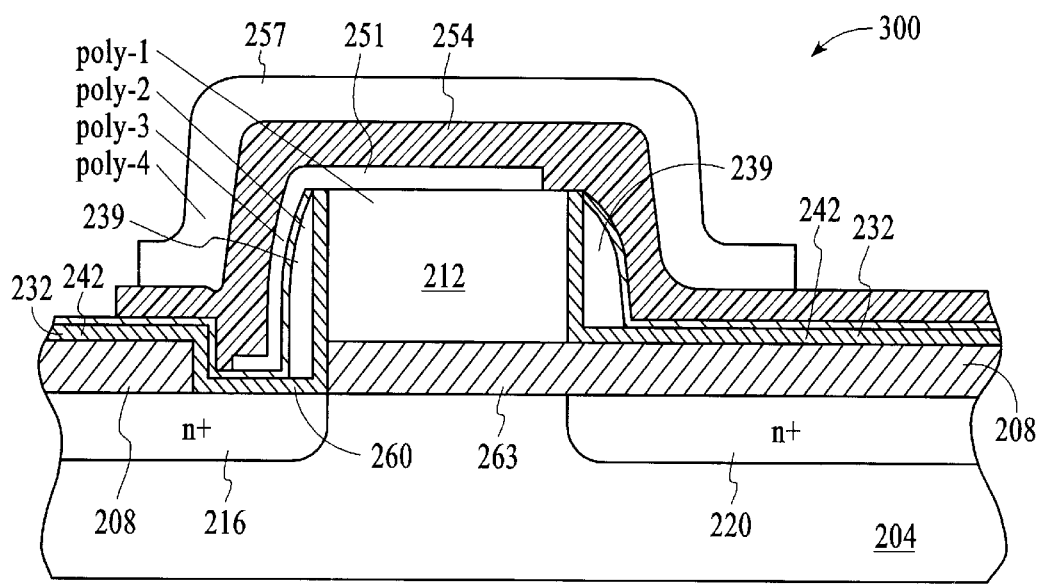
FIG. 3 is another preferred embodiment of the non-volatile memory cell of the present invention.

With reference to FIG. 3, another embodiment is shown in which memory cell 300 is the same as memory cell 200 of FIG. 2I, except that thin silicon oxide layer 232 is removed completely from the top of poly-1 region 212 by using a chemical-mechanical polishing (CMP) process to expose surface 248 of poly-1 region 212. After that, poly-3 layer 251, insulating ONO layer 254, and poly-4 layer 257 are in turn formed on the structure as in the case of memory cell 200 of FIG. 2H.

The non-volatile memory cell of the present invention also comprises a select transistor which is well known in the art and therefore is not discussed in here.

What is claimed is:

1. A method of fabricating a self-aligned non-volatile memory cell on a semiconductor substrate, said method comprising the steps of:

forming a first insulating layer over said substrate;

forming a main floating gate region on said first insulating layer;

modifying a first portion of said first insulating layer next to a side of said main floating gate region to form a thin insulating region, said thin insulating region being thinner than a second portion of said first insulating layer under said main floating gate region;

forming a small sidewall spacer over said thin insulating region;

forming a second insulating layer over said first insulating layer and over said small sidewall spacer;

removing a portion of said second insulating layer and said thin insulating region over said main floating gate region to expose a surface on top of said main floating gate region;

forming a thin connecting layer over and in physical contact with both said small sidewall spacer and said main floating gate region, said thin connecting layer contacting said main floating gate region via said surface, whereby said small sidewall spacer is electrically connected to said main floating gate region, and whereby said main floating gate region, said small sidewall spacer and said thin connecting layer form a floating gate of said non-volatile memory cell;

forming a third insulating layer over at least said floating gate; and forming a control gate over said second insulating layer and above at least said floating gate.

2. The method of claim 1 wherein modifying a first portion of said first insulating layer comprises the steps of:

removing said first portion of said first insulating layer; and forming said thin insulating region where said first portion of said first insulating layer once was.

3. The method of claim 2 wherein forming a small sidewall spacer comprises the steps of:

forming a conducting layer over at least said thin insulating region; and etching said conducting layer to form said small sidewall spacer.

4. The method of claim 3 wherein said etching conducting layer comprises anisotropically etching.

5. The method of claim 1 wherein forming said thin insulating region comprises the step of forming a thin insulating layer at least over the place where said first portion of said first insulating layer once was and over said main floating gate region.

6. The method of claim 5 wherein forming a small sidewall spacer comprises the steps of:

forming a conducting layer over at least said thin insulating region; and etching said conducting layer to form said small sidewall spacer.

7. The method of claim 6 wherein etching said conducting layer comprises anisotropically etching.

8. The method of claim 7 wherein forming a third insulating layer comprises forming an Oxide/Nitride/Oxide (ONO) layer.

9. The method of claim 1 wherein forming a small sidewall spacer comprises the steps of:

forming a conducting layer over at least said thin insulating region; and etching said conducting layer to form said small sidewall spacer.

10. The method of claim 9 wherein etching said conducting layer comprises anisotropically etching.

11. The method of claim 1 wherein removing a portion of said thin insulating layer over said main floating gate region comprises using photoresist masks and wet-etch to help remove said portion of said thin insulating layer.

12. The method of claim 1 wherein removing a portion of said thin insulating layer over said main floating gate region comprises using a chemical mechanical polishing process to remove said portion of said thin insulating layer.

* * * * *